United States Patent [19]

Schreck et al.

[11] Patent Number: 5,020,026
[45] Date of Patent: May 28, 1991

[54] METHOD AND APPARATUS FOR READING AND PROGRAMMING ELECTRICALLY PROGRAMMABLE MEMORY CELLS

[75] Inventors: John F. Schreck; Phat C. Truong, both of Houston, Tex.

[73] Assignee: Texas Instruments Incorporated, Dallas, Tex.

[21] Appl. No.: 450,702

[22] Filed: Dec. 14, 1989

[51] Int. Cl.$^5$ .................................. G11C 11/40
[52] U.S. Cl. ............................ 365/104; 365/185; 365/230.06
[58] Field of Search ............... 365/185, 104, 230.06

[56] References Cited

U.S. PATENT DOCUMENTS

| | | | |
|---|---|---|---|
| 3,934,233 | 1/1976 | Fisher et al. | 340/173 |
| 4,021,781 | 5/1977 | Caudel | 340/172.5 |
| 4,281,397 | 7/1981 | Neal et al. | 365/189 |
| 4,722,075 | 1/1988 | Kaszubinski et al. | 365/226 |
| 4,868,790 | 9/1989 | Wilmoth et al. | 365/210 |

OTHER PUBLICATIONS

"A 20ns 1Mb CMOS Burstmode EPROM", Session 2: High Speed SPRAMs, published in the Digest of Technical Papers for ISSCC 89 Conference, 2-15-89, pp. 40-41.

Primary Examiner—Joseph A. Popek
Attorney, Agent, or Firm—Ronald O. Neerings; Thomas W. DeMond; Melvin Sharp

[57] ABSTRACT

Apparatus for decoding a plurality of electrically programmable memory cells (30-70) comprises an array source driver circuit (72) for selectively connecting a first terminal (140) of a selected memory cell (152) to a program bias voltage or to ground. A bit line driver circuit (94-100, 120) selectively connects a second terminal (154) of said selected memory cell (152) to ground or to a read sense node (115). Reading is performed by connecting the first terminal (140) to ground and the second terminal (154) to the read sense node (115). Programming is performed by connecting the first terminal (140) to the program bias voltage and the second terminal (154) to ground.

26 Claims, 3 Drawing Sheets

METHOD AND APPARATUS FOR READING AND PROGRAMMING ELECTRICALLY PROGRAMMABLE MEMORY CELLS

TECHNICAL FIELD OF THE INVENTION

This invention relates to programmable memory devices, and more particularly to method and apparatus for reading and programming electrically programmable memory cells.

BACKGROUND OF THE INVENTION

Many electrically programmable read only memory (EPROM) devices are of the virtual or decoded ground design. Virtual ground EPROMs are disclosed in U.S. Pat. No. 3,934,233 issued to Fisher and Rogers, U.S. Pat. No. 4,021,781 issued to E. R. Caudel, and U.S. Pat. No. 4,281,397 issued to Neal and Reed, all assigned to Texas Instruments.

Memory cells in virtual ground arrays are arranged in rows and in columns orthogonal to the rows. Adjacent columns of the memory cells share a bit line, such that first ends of the current paths of an adjacent pair of cells on any one row are connected to one bit line. The other ends of the current paths of the cells are connected to different array sources or decoded ground lines.

In order to read a cell, an array source or decoded ground on one end of a current path of a selected memory cell is brought low. The bit line is connected to a voltage bias source. If the memory cell is conductive, a current flows from the bit line to the array source of the memory cell. The conductance state of the memory cell may be ascertained by sensing the voltage level of the bit line.

If a memory cell is to be programmed, the array source is also brought low, and the bit line is connected to a source of a relatively high voltage, such as approximately 12 volts. Note that in this instance, the current flow direction is also from the bit line to the array source of the memory cell. Arranged in this manner, the memory cells have dedicated drain and source paths, where the current always flows in the same direction.

It is desirable to keep the voltage level on the bit line or the drain as low as possible during read mode to reduce or eliminate a hot electron effect, by which electrons enter the floating gate from the channel of the device, "read disturbing" the state of the memory cell. However, it is also desirable to raise the voltage level on the bit line to lower the junction capacitance of the drain. The drain of a device should be constructed to optimize device programming, but such optimization also exacerbates "read disturb." It seems, from the foregoing, that because of the different and contradicting requirements for reading and programming memory cells, a memory device having optimal reading and programming characteristics is not possible.

The present invention is directed to overcoming the above problems.

SUMMARY OF THE INVENTION

In accordance with the present invention, methods and apparatus for decoding electrically programmable memory cells are provided which substantially eliminate or reduce disadvantages and problems associated with prior circuits.

In an aspect of the present invention, apparatus for reading and programming an electrically programmable memory cell having a current path with first and second terminals which comprises an array source driver circuit coupled to the first terminal, a ground source and a program bias voltage source coupled to the array source driver circuit. The array source driver circuit, upon the receipt of a read mode signal, couples the first terminal to ground. The array source driver circuit, upon the receipt of a program mode signal, couples the first terminal to the program bias voltage source. In addition, the second terminal of the memory cell is coupled to a bit line driver circuit, a read sense node and ground. The bit line driver circuit couples the second terminal to ground in response to receiving the program mode signal, or to the read sense node in response to receiving the read mode signal.

An important technical advantage of the present invention is that it provides for a memory cell operable to be read from one side and programmed from the other.

Another important technical advantage provides memory cells in an EPROM which may be optimized for both reading and programming.

BRIEF DESCRIPTION OF THE DRAWINGS

For a better understanding of the present invention, reference may be made to the accompanying drawings, in which.

DETAILED DESCRIPTION OF THE INVENTION

Figure 1:
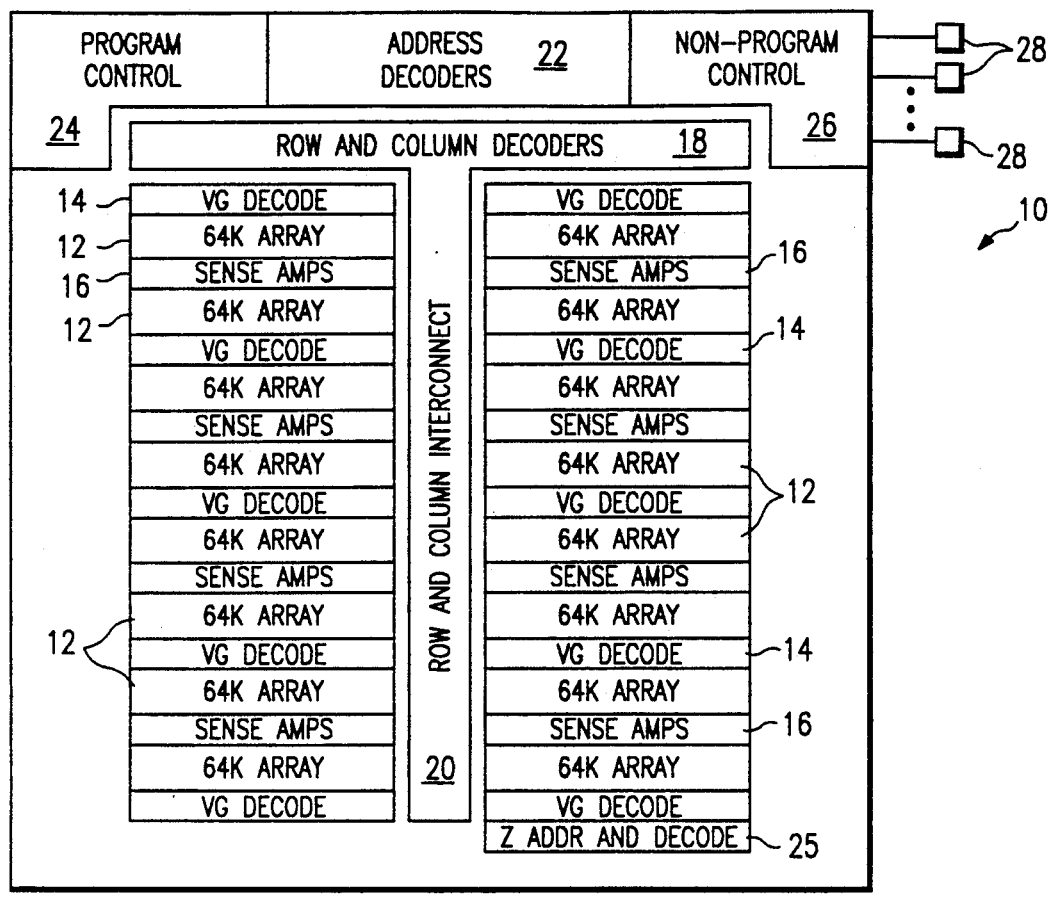
FIG. 1 is a high level schematic block diagram of a one-megabyte electrically programmable read only memory showing an approximate geographical location of cell arrays and circuit blocks on a chip.

FIG. 1 is a high level schematic block diagram showing central portions of a chip on which a one-megabyte complementary metal oxide semiconductor, electrically programmable read-only memory array is fabricated. This one-megabyte array is indicated generally at 10. Array 10 is organized into sixteen 64K array sections 12. Located between pairs of array sections 12 are virtual ground decoder section 14 and sense amplifier section 16. Each sense amplifier section 16 contains 32 sense amplifiers, sixteen for each adjacent array section.

In the illustrated embodiment, the array sections 12, together with their virtual ground decoder sections 14 and sense amplifier sections 16, are organized in a higher-order array of two columns and eight rows. A row and column decoder section 18 is situated at the top of this higher-order array, and is connected to the respective array sections 12, virtual ground decoder sections 14 and sense amplifier sections 16 through a row and column interconnect section 20. An address decoder section 22 has outputs that connect to the adjacent row and column decoder section 18. In the illustrated embodiment, a program control block 24 is situated in the upper left hand corner of the chip and a nonprogram control block 26 is situated in the upper right corner of the chip. In the illustrated embodiment, a Z address and decoder section 25 is spatially separated from address decoder section 22 and is located in the lower right hand corner of the die 10. A plurality of I/O (input/output) pads 28 are coupled to nonprogram control block 26 for off-chip communications.

Figure 2:
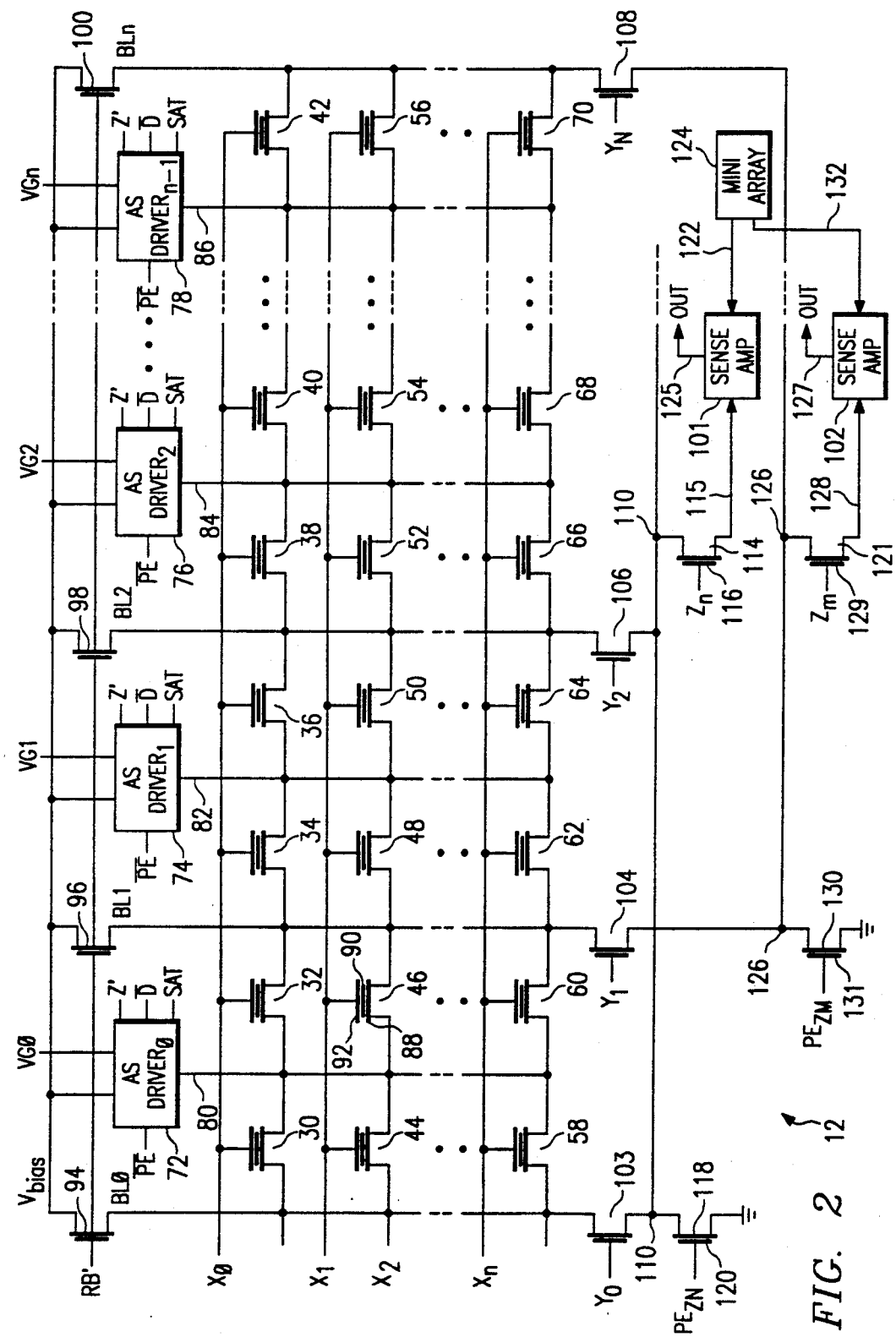
FIG. 2 is a schematic electrical circuit diagram of a small section of one of the cell arrays and associated circuitry shown in FIG. 1.

FIG. 2 is a more detailed electrical schematic diagram of a portion of one of the 64K array sections 12. Shown is a plurality of electrically programmable read-only memory cells 30–70, which are arranged in a plurality of rows and in a plurality of columns orthogonal to the rows. Each row of cells has associated therewith a row or word line X0, X1 ... Xn. Each pair of columns of cells has associated therewith a bit line BL1, BL2 ... BLn−1. Outside bit lines BL0 and BLn are each associated with only one column of memory cells. Pairs of columns of cells also have associated therewith a respective one of the AS (array source) driver circuits 72–78. Each AS driver circuit 72–78 is connected to a respective decoded or virtual ground signal source VG0, VG1 ... VGn and further to a bias voltage source $V_{bias}$ which, for example, may be 1.7 volts. Each AS driver circuit 72–78 has as an output a respective one of the AS driver lines 80–86 that is connected to the current path of each cell in a pair of columns of cells. AS driver circuits 72–78 receive control signals $\overline{PE}$, Z' and SAT and data $\overline{D}$, where Z' is representative of signals derived from a decode signal Z, discussed below.

The memory cells 30–70 are constructed to be substantially uniform. Using as an example memory cell 46, each memory cell has a current path 88, a floating gate 90 and a control gate 92. The current path of each memory cell is connected between an AS driver line and an associated bit line. For example, cell 46 has a current path 88 that is connected between the AS driver line 80 and the bit line BL1. The control gate of each memory cell is connected to an associated word line for the row. Again using cell 46 as an example, the control gate 92 thereof is connected to word line X1.

The voltage source $V_{bias}$ is connected to the respective bit lines BL0, BL1, BL2 ... BLn through respective ones of n-channel field effect transistors 94–100. The gates of transistors 94–100 are connected to a read bias voltage supply signal, RB'. Signal RB' is derived from a read bias signal RB (later described) and preferably is about 0.1 volt lower than RB. RB is used within sense amplifiers 101 and 102. The voltage difference between the two signals keeps the bit lines from floating and prevents any interference in the sensing operation, as there will be less current contribution.

Respective n-channel field effect decoding transistors 103–108 have current paths which terminate respective ends of bit lines BL0, BL1, BL2, ... BLn, which ends are opposed to the ends connecting to transistors 94–100. The transistors 103–108 have gates which are respectively connected to Y-decoding signals Y0, Y1, Y2 ... Yn. Transistors 103–108 are divided into even and odd transistor columns, where, for example, transistors 103 and 106 are even and transistors 104 and 108 are odd.

The current paths of even transistors 103, and 106, etc. selectively connect their respective bit lines BL0, BL2, ... BLn−1 (not shown) to a node 110, which in turn is connected through the current path of a field effect transistor 114 and a line 115 to the sense amplifier 101. A gate 116 of transistor 114 is connected to a decoded signal $Z_n$. Node 110 is selectively connected to ground through the current path of a field-effect transistor 118, whose gate 120 is connected to a source of a program enable signal $PE_{ZN}$.

The sense amplifier 101 compares the signal that it receives on sense line 115 to the signal received on a reference line 122. The reference line 122 is connected to a selected point within a mini-array of, for example, 16 read-only memory cells. The point in the array to which the reference line 122 is connected is programmable such that the state of an operational cell inside the mini-array 124 may be preselected.

The odd transistors 104 through 108 selectively connect their respective bitlines BL1, BL3 ... BLn to a node 126, which in turn is connected through a current path of an n-channel field effect transistor 121 and a line 128 to the sense amplifier 102. A gate 129 of transistor 121 is connected to a decoded signal $Z_m$. Node 126 is also selectively connected to ground through the current path of a field effect transistor 130, whose gate 131 is connected to a source of a decoded program enable signal $PE_{ZM}$. The sense amplifier 102 corresponds to the sense amplifier 101 and compares the signal received on the sense line 128 to a reference value received on a reference line 132 connected to a predetermined point within the miniarray 124.

Figure 3:
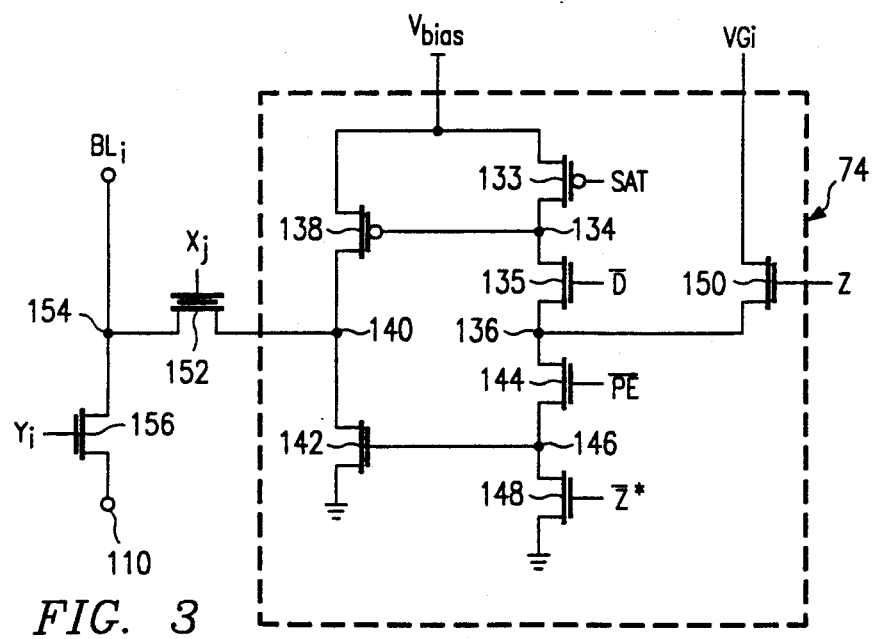
FIG. 3 is a detailed electric circuit diagram of an array source (AS) driver circuit and corresponding memory cell for use with the array shown in FIG. 2.

FIG. 3 illustrates the circuitry of the AS driver circuit 74 in more detail, it being understood that the circuitry shown in FIG. 3 is equally present in each of the AS drivers 72–78. The current path of a p-channel field effect transistor 133 selectively connects a bias voltage source $V_{bias}$ to a node 134. P-channel transistor 133 is fabricated within a tank (not shown) of n-type semiconductor material, which in turn is formed in a p-type semiconductor substrate. This tank is also connected to $V_{bias}$. Node 134 is selectively connected through a current path of an n-channel field effect transistor 135 to a node 136. A current path of a p-channel field effect transistor 138 selectively connects $V_{bias}$ to an AS output node 140. The tank of transistor 138 is connected to $V_{bias}$. Output node 140 is also selectively connected through a current path of an n-channel field effect transistor 142 to ground or $V_{SS}$.

An n-channel field effect transistor 144 has a current path that selectively connects the node 136 to a node 146, which is in turn connected to the gate of the n-channel transistor 142. The node 146 is further selectively connected through a current path of an n-channel transistor 148 to ground.

The gate of p-channel transistor 133 is connected to a signal SAT. The gate of n-channel transistor 135 is connected to signal $\overline{D}$. The gate of the n-channel transistor 144 is connected to an inverse program enable signal, $\overline{PE}$. The gate of the n-channel transistor 148 is connected to an inverse decoding signal $\overline{Z}^*$. The node 136 is selectively connected through the current path of an n-channel field effect transistor 150 to a decoded or virtual ground source $VG_i$ where i can be 1 through n. The gate of transistor 150 is connected to a source of a decoding signal Z.

The $V_{bias}$ signal source is a voltage supply that is maintained a p-channel V plus 0.5v higher than a chip low voltage source $V_{ss}$. Referring to FIG. 3 in conjunction with FIG. 1, the virtual ground signal $VG_i$ originates in a corresponding VG decoding section 14. The signals SAT and $\overline{PE}$ originate in the program control section 14, while components of signal Z originate in the Z decoder section 25 and Z and $\overline{Z}^*$ are generated in the VG decode 14 and sense amp 16 sections.

The output node 140 of AS driver 74 is connected to memory cell 152 on a word line $Z_j$. Memory cell 152 is representative of memory cells 30-70 shown in FIG. 2. Memory cell 152 is connected to a corresponding bit line $BL_i$ at node 154, which is then coupled to n-channel transistor 156 controlled by signal $Y_i$. Transistor 156 selectively connects node 154 to node 110 or node 126 (FIG. 2), which is then selectively connected to sense amplifier 101 or 102 through transistor 114 or 121 controlled by signal $Z_n$ or $Z_m$. Signals $PE_{ZN}$ and $PE_{ZM}$ may selectively connect nodes 110 or 126 to ground.

Figure 4:
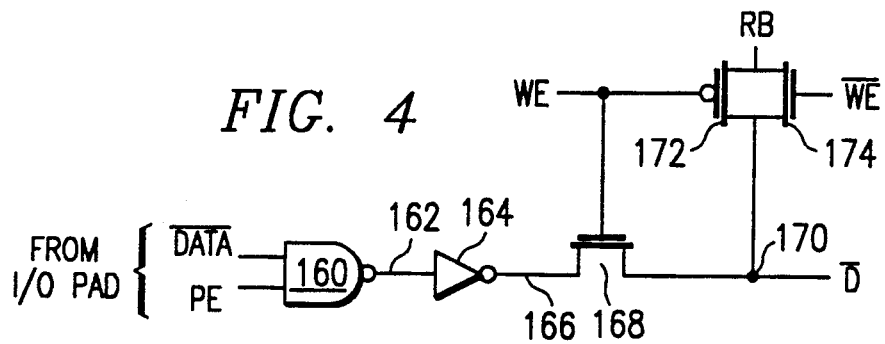
FIG. 4 is an electrical schematic diagram of a peripheral circuit for originating a $\overline{D}$signal used in the AS driver circuit illustrated in FIG. 3.

FIG. 4 is an electrical schematic diagram of a circuit for generating the signal e,ovs/D/. A NAND gate 160 has a $\overline{DATA}$ input and a PE input which have their origins external to the chip 10. PE, or program enable, is high only when the array 10 is being programmed. An output 162 of the NAND gate 160 is connected to the input of an inverter 164. An output 166 of the inverter 164 is selectively connected through a current path of an n-channel field effect transistor 168 to a $\overline{D}$ output node 170. An externally generated write enable (WE) signal is applied to the gate of a p-channel field effect transistor 172, as well as to the gate of the transistor 168.

The inverse write enable signal, $\overline{WE}$, is applied to the gate of an n-channel transistor 174. The read bias signal RB is communicated to the $\overline{D}$ output node 170 either through p-channel transistor 172, in the instance that $\overline{WE}$ is in the low state, or through the current path of n-channel transistor 174, in the instance that $\overline{WE}$ is in a high state. Hence, when $\overline{WE}$ is equal to zero, and therefore $\overline{WE}$ is equal to one, the RB signal is transmitted to node 170. Otherwise, RB will be isolated from the output node 170.

For the high state of $\overline{WE}$, transistor 168 is conductive, hence a signal may be passed from node 166 to the $\overline{D}$ output node 170. Node 166 will go high only when $\overline{DATA}$ and PE are high, hence e,ovs/D/ at node 170 will be high only when PE is high, the latter of which occurs only when the EPROM is being programmed. As noted above, $\overline{D}$ will take the value of RB when WE is high.

Figure 5:
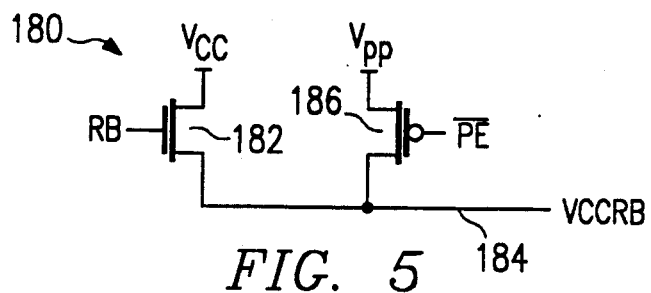
FIG. 5 is an electric circuit diagram of a peripheral circuit for generating a $V_{cc}RB$ signal as used in the AS driver circuit shown in FIG. 3.

FIG. 5 is an electrical circuit diagram of a circuit, indicated generally at 180, for generating $V_{cc}RB$. Like the circuit shown in FIG. 4, the $V_{cc}RB$ circuit is situated within program control block 24 on the chip (FIG. 1). An n-channel field effect transistor 182 has a gate connected to the signal RB and a drain connected to a voltage supply $V_{cc}$. The source of transistor 182 is connected to a $V_{cc}RB$ output node 184. A p-channel field effect transistor 186 has a gate connected to a signal source for $\overline{PE}$, the inverse of the PE original. A source of transistor 186 is connected to a programming voltage source $V_{pp}$, and a drain thereof is connected to the $V_{cc}RB$ output node 184. As can be seen, the output node $V_{cc}RB$ may be brought to the value of RB-$V_{tn}$ when RB is high; the value of RB is such that $V_{cc}RB$ will be approximately 0.5 over a $V_{tp}$ on the read mode. Alternatively, $V_{cc}RB$ may be at substantially a $V_{pp}$ voltage value when $\overline{PE}$ is low. $V_{tn}$ and $V_{tp}$ are n-channel and p-channel threshold voltages, respectively.

Figure 6:
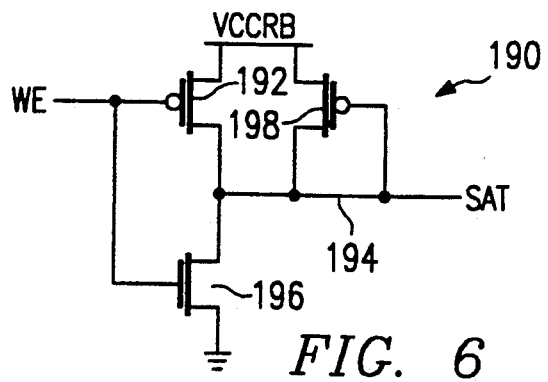
FIG. 6 is a detailed electric circuit diagram of a peripheral circuit for generating a SAT signal as used in the AS driver circuit illustrated in FIG. 3.

FIG. 6 is a schematic electrical circuit diagram of a signal generating circuit, indicated generally at 190, for producing the SAT signal. A p-channel field effect transistor 192 has a gate connected to the write enable signal source WE. A source of the transistor 192 is connected to the $V_{cc}RB$ voltage supply source, which in turn is generated using the signal generation circuit 180 as shown in FIG. 5. A drain of the transistor 192 is connected to a SAT output node 194. This output node is also connected to the drain of an n-channel field effect transistor 196, whose gate is connected to the WE signal source. A source of the transistor 196 is connected to ground. A p-channel field effect transistor 198 has its source connected to the $V_{cc}RB$ voltage supply and its drain connected to the SAT output node 194. The gate of the transistor 198 is also connected to the SAT output node.

When the WE signal is high, n-channel transistor 196 will be turned on and the p-channel transistor 192 will be turned off. During this condition, the p-channel transistor 198 will hold the SAT signal at $V_{cc}RB$ minus a p-channel $V_t$. In the programming mode, this value will approximate $V_{pp}$ minus a p-channel $V_t$. This is because transistor 196 is relatively small in comparison to transistor 198, therefore transistor 198 limits the value to which the SAT signal can drop. Whenever the SAT signal goes to VCCRB-$V_{tp}$, transistor 133 in FIG. 3 will be turned on. The transistor 133 will be in a high impedance state because its gate does not go to ground. The SAT signal therefore limits the current through transistor 133. When WE is low, transistor 196 is off while transistor 192 is on. Therefore, SAT is at $V_{cc}RB$ in the read mode.

Referring back to FIGS. 2-6 and using memory cell 152 in FIG. 3 as an example, the read and program operations of memory cells 30-70 may be discussed. During a read operation, where it is desirable to read memory cell 152, the corresponding decoded signals $X_j$ and $Y_i$ are high. $X_j$ and $Y_i$ select the word line and bit line, respectively, of the memory cell 152, thereby selecting this cell. In addition, signal $VG_i$ is at a voltage level equal to chip high voltage source V and is passed to node 136 through transistor 150 which is turned on by a high signal Z.

Signal $\overline{D}$ is at a voltage level equivalent to read bias signal RB' generated by a low $\overline{WE}$ signal that enables pass transistors 172 and 174 in the circuit shown in FIG. 4. Signal RB may be approximately 2.8 volts. Signal $\overline{D}$ turns on transistor 135, which allows the high $VG_i$ signal to be passed to node 134. Since signal SAT, connected to the gate of transistor 133, is at a voltage level equivalent to $V_{cc}RB$, transistor 133 is off. Transistor 138 is also off, because node 134 connected to its gate is high. Since program enable signal PE is high only when programming, $\overline{PE}$ is high during read and turns on transistor 144 to pass the high $VG_i$ signal from node 136 to node 146. Transistor 148, connecting node 146 to ground, is off due to a low $\overline{Z}^*$ signal, so node 146 remains high. The high voltage level at node 146, connected to the gate of transistor 142, turns transistor 142 on and pulls node 140 to ground. One side of memory cell 152 is thus at a voltage level close to ground.

On the other side of memory cell 152, node 154 is connected to a bit line $BL_i$ which is connected to $V_{bias}$ through a corresponding transistor among transistors 94-100 shown in FIG. 2. Since RB is at a nonzero voltage level passed through transistor 182 shown in FIG. 5, then node 154 is kept near voltage level $V_{bias}$. Node 154 is also connected to node 110 through transistor 156, which is turned on by signal $Y_i$, and further connected to one of sense amplifiers 101 and 102 through one of transistors 114 and 121 shown in FIG. 2. Constructed in this manner, memory cell 152 may be read by a sense amplifier by detecting the voltage level at node 154.

Peculiar to FAMOS devices, when a memory cell is in a programmed state, there are electrons resident on the floating gate. Since electrons are present in the floating gate, the path between the drain and source of the memory cell 152 is nonconductive, so the voltage level at node 154 remains near $V_{cc}RB$. If memory cell 152 is in an erased state, then there are no electrons in the floating gate, so the drain to source path is conductive. Thus the voltage level at node 154 is effectively pulled to a level slightly below $V_{cc}RB$ through transistor 142. Accordingly, assuming sense amplifier 101 is used for bit line $BL_i$, node 115 input to sense amplifier 101 is high for a programmed memory cell and low for an erased memory cell.

During programming, memory cell 152 is selected by corresponding word and bit lines. A high voltage level is supplied to the corresponding word line $X_j$, which is connected to the gate of memory cell 152. Signal $Y_i$ is also high to turn on transistor 156.

The Z signal at the gate of transistor 150 is high, enabling transistor 150 to pass a low $VG_i$ signal to node 136. Unlike the read operation where a selected $VG_i$ is high, a selected $VG_i$ is low during programming.

Referring to FIGS. 3 and 4, signal $\overline{PE}$ is at a voltage level of approximately 12 volts, which in effect enables NAND gate 160 to pass $\overline{DATA}$ to D at node 170. $\overline{Dis}$ connected to the gate of transistor 135, which is turned on or off depending on the voltage level of WE. Where the selected memory cell is to be programmed with a "zero," $\overline{Dis}$ high and transistor 135 is on. Furthermore, transistor 144 is off due to the low voltage level of $\overline{PE}$ and transistor 148 is on due to the high $\overline{Z}^*$, the combination of which pulls node 136, node 146 and node 134 to ground Transistor 142 is off due to the low voltage level at node 146. Note that $\overline{Z}^*$ is equal to the inverse of signal Z except during programming, when it remains high.

The gate of transistor 133 is connected to signal SAT, which is generated by the circuit shown in FIG. 6. SAT is maintained at a voltage level equivalent to a level $V_{cc}RB - V_t$. The generation of SAT involves signal $V_{cc}RB$ which is generated by the circuit shown in FIG. 5. $V_{cc}RB$ is at a voltage level equal to $V_{pp}$ when $\overline{PE}$ is low, therefore $V_{cc}RB$ is approximately 12 volts during programming. The voltage level of SAT is such that p-channel transistor 133 is at high impedance.

Additionally, the low voltage level at node 134 turns on p-channel transistor 138, which effectively pulls node 140 to a voltage level equivalent to $V_{bias}$. On the other side of memory cell 152, Signal $PE_{ZN}$ controlling transistor 118 (FIG. 2) and decoded signal $Y_i$ controlling transistor 156 are both high to pull node 154 or the corresponding bit line to ground. Preferably, a high voltage of approximately 15 volts may be supplied to signals $PE_{ZN}$ or $Y_i$ to enable a more conductive path from node 154 to ground without increasing the device size of transistors 118 and 156. In this manner, selected memory cell 152 may be programmed.

During both the read and program operations, memory cells are deselected by supplying appropriate low $X_j$ and $Y_i$ signals. In addition, a deselected memory cell during read has the corresponding $VG_i$ low, thus pulling node 136 low and turning transistor 138 on. Transistor 138 conducts and pulls node 140 to $V_{bias}$. Effectively, both nodes 140 and 154 of memory cell 152 are at the same voltage level, so that no current is flowing.

A deselected memory cell during programming has signal Z low, which disables transistor 150. Signal $VG_i$ is high for the deselected array source (AS) drivers during programming. $\overline{D}$ for the deselected memory cell is low, which turns off transistor 135. Node 134 is then isolated from $VG_i$. Signal SAT is at $V_{cc}RB - V_t$, which turns transistor 133 on and pulling node 134 to $V_{bias}$. Transistor 138, the gate of which is connected to node 134, is thus off. In this fashion, no current may flow through deselected memory cell 152. Note that in order to deselect a memory cell, any one of the above logic levels for $VG_i$, Z and $\overline{Dis}$ sufficient.

It is enlightening to note that during a read operation, current flows from node 154 to node 140, where node 154 is at a voltage level equivalent to $V_{bias}$, which is equal to approximately 1.5 volts, and node 140 is at ground. On the other hand, during programming current flows from node 140 to node 154, node 140 being at a voltage level equivalent to $V_{bias}$, which is approximately 12.5 volts, and node 154 being at ground.

It is also important to note that since the memory cells may be read from one side and programmed from the other, memory cell junctions on either side may be optimized for their function. For example, the side for reading may be a graded junction or a lightly doped drain to eliminate or reduce the hot carrier effect as known in the art. Additionally, the program side may be an abrupt junction to optimize programming. Constructed in this manner, the memory cells in the device are optimal for both reading and programming.

In summary, methods and apparatus have been shown and described for reading and programming electrically programmable read only memory cells. The present invention eliminates the aforementioned problems associated with typical memory cell decoding circuits.

While illustrated embodiments and their advantages have been described in the above detailed description, the invention is not limited thereto, but only by the spirit and scope of the appended claims.

What is claimed is:

1. Apparatus for reading and programming an electrically programmable memory cell having a current path with first and second terminals, the apparatus comprising:
   an array source driver circuit coupled to said first terminal, a ground source and a program bias voltage source coupled to said array source driver circuit;
   at least one read mode signal received by said array source driver circuit, said circuit coupling said first terminal to ground in response to receiving said read mode signal;
   at least one program mode signal received by said array source driver circuit, said circuit coupling said first terminal to said program bias voltage source in response to receiving said program mode signal;
   a bit line driver circuit coupled to said second terminal, a read sense node and ground and coupled to receive said read and program mode signals, said bit line driver circuit coupling said second terminal to ground in response to receiving said program mode signal, said bit line driver circuit coupling said second terminal to said read sense node in response to receiving said read mode signal.

2. The apparatus, as set forth in claim 1, wherein said array source driver circuit is operable to receive a virtual ground control signal indicative of either read or program operation.

3. The apparatus, as set forth in claim 1, wherein said array source driver circuit comprises:
- a first p-channel field effect transistor having a gate, a current path of said transistor selectively coupling said program bias voltage and said first terminal of said memory cell;
- a first n-channel field effect transistor having a gate, a current path of said n-channel transistor selectively coupling ground and said first terminal of said memory cell; and
- a control circuit coupled to said gates for selectively enabling either said first p-channel or said first n-channel field effect transistor.

4. The apparatus, as set forth in claim 3, wherein said control circuit comprises:
- a second p-channel field effect transistor having a current path selectively coupling said program bias voltage and a first node, and said second p-channel transistor enabled by a control signal;
- a second n-channel field effect transistor having a current path selectively coupling said first node and a second node, and said second n-channel transistor enabled by an inverse data signal;
- a third n-channel field effect transistor having a current path selectively coupling said second node and a third node, and said third n-channel transistor enabled by an inverse program enable signal;
- a fourth n-channel field effect transistor having a current path selectively coupling said third node and ground, and said fourth n-channel transistor enabled by a decoded signal; and
- the gate of said first p-channel field effect transistor connected to said first node, and the gate of said first n-channel field effect transistor connected to said third node.

5. The apparatus, as set forth in claim 4, wherein said array source driver circuit further comprises a fifth n-channel field effect transistor having a current path coupling a virtual ground control signal and said second node, said fifth n-channel transistor enabled by a second decoded signal.

6. The apparatus, as set forth in claim 5, wherein said array source driver circuit is selected by enabling said fifth transistor and deselected by disabling said fifth transistor.

7. The apparatus, as set forth in claim 4, wherein said first p-channel field effect transistor is fabricated within a tank of n-type semiconductor material, and said tank is connected to said program bias voltage, and said second p-channel field effect transistor is also fabricated within a tank of n-type semiconductor material, and said tank is also connected to said program bias voltage.

8. The apparatus, as set forth in claim 1, wherein said bit line driver circuit comprises:
- a first n-channel field effect transistor having a current path coupling said read sense node and said second terminal; and
- a second n-channel field effect transistor having a current path coupling said second terminal and ground, said second transistor enabled by a decoded signal.

9. The apparatus, as set forth in claim 1, wherein said cell is one of a plurality of electrically programmable memory cells arranged in rows and in columns disposed at an angle to the rows, said memory cells are coupled to a plurality of array source driver circuits and bit line driver circuits, each of said array source driver circuits connected to the first terminals of two adjacent memory cells and is operable to drive at least one column of said memory cells, each of said bit line driver circuits is connected to the second terminals of two adjacent memory cells and is operable to drive at least one column of said memory cells, the array source drivers and bit line drivers are disposed alternately between said columns of memory cells.

10. The apparatus, as set forth in claim 9, wherein each of said array source driver circuits is coupled to first terminals of two adjacent columns of memory cells, and each of a plurality of said bit line driver circuits coupled to second terminals of two adjacent columns of memory cells.

11. An array of electrically programmable, read only memory devices, comprising:
- a plurality of electrically programmable memory cells arranged in rows and columns;
- a plurality of array source lines, each disposed between a pair of adjacent columns of memory cells and coupled to first terminals of said memory cells;
- a plurality of bit lines, each disposed between a pair of adjacent columns of memory cells and coupled to second terminals of said memory cells;
- a plurality of array source driver circuits, each coupled to an array source line, for selectively connecting a first terminal of a selected memory cell to a program bias voltage in response to a program mode signal and to ground in response to a read mode signal;
- a plurality of bit line driver circuits, each coupled to a bit line, for selectively connecting a second terminal of a selected memory cell to a sense node in response to said read mode signal and to ground in response to said program mode signal; and
- a sense circuit coupled to said bit lines through an address decode transistor.

12. The array, as set forth in claim 11, wherein said array source driver circuits are operable to decode said selected memory cell in a read mode by connecting said first terminal to ground and said second terminal to said sense node having a read bias voltage, and are further operable to decode said selected memory cell in a program mode by connecting said first terminal to said program bias voltage and said second terminal to ground.

13. The array, as set forth in claim 11, wherein each said array source driver circuit is operable to receive a virtual ground control signal indicative of either read or program operation.

14. The array, as set forth in claim 11, wherein each said array source driver circuit comprises:
- a first p-channel field effect transistor having a gate, a current path of said first p-channel transistor selectively coupling said program bias voltage and said first terminal of said memory cell;
- a first n-channel field effect transistor having a gate, a current path of said first n-channel transistor selectively coupling ground and said first terminal of said memory cell; and
- a control circuit coupled to said gates for selectively enabling either said first p-channel or said first n-channel field effect transistor.

15. The array, as set forth in claim 14, wherein said control circuit comprises:

a second p-channel field effect transistor having a current path selectively coupling said program bias voltage and a first node, and said second p-channel transistor enabled by a control signal;

a second n-channel field effect transistor having a current path selectively coupling said first node and a second node, and said second n-channel transistor enabled by an inverse data signal;

a third n-channel field effect transistor having a current path selectively coupling said second node and a third node, and said third n-channel transistor enabled by an inverse program enable signal;

a fourth n-channel field effect transistor having a current path selectively coupling said third node and ground, and said fourth n-channel transistor enabled by a decoded signal; and the gate of said first p-channel field effect transistor connected to said first node, and the gate of said first n-channel field effect transistor connected to said third node.

16. The array, as set forth in claim 15, wherein each said array source drive circuit further comprises a fifth n-channel field effect transistor having a current path coupling a virtual ground control signal and said second node, said fifth transistor enabled by a second decoded signal.

17. The array, as set forth in claim 16, wherein an array source driver circuit is selected by enabling said fifth transistor and deselected by disabling said fifth transistor.

18. The array, as set forth in claim 15, wherein a tank of said first p-channel field effect transistor is connected to said program bias voltage, and a tank of said second p-channel field effect transistor is also connected to said program bias voltage.

19. The array, as set forth in claim 11, wherein each said bit line driver circuit comprises:

a first n-channel field effect transistor having a current path coupling said read mode signal and said second terminal; and a second n-channel field effect transistor having a current path coupling said second terminal and ground, said second transistor enabled by a decoded signal.

20. Apparatus for reading and programming a plurality of memory cells each having current paths with first and second terminals, comprising:

means for selecting one of said plurality of cells;

means for reading said selected memory cell by coupling said first terminal to ground and said second terminal to a sense node; and means for programming said selected memory cell by coupling said first terminal to a program bias voltage and said second terminal to ground.

21. Apparatus, as set forth in claim 20, wherein said memory cells have first and second semiconductor junctions.

22. Apparatus, as set forth in claim 21, wherein said first junction is a graded junction, and said second junction is an abrupt junction.

23. Apparatus, as set forth in claim 20, wherein a current flows from said second terminal to said first terminal of said selected memory cell during reading of said selected memory cell, and a current flows from said first terminal to said second terminal of said selected memory cell during programming of said selected memory cell.

24. A method for decoding a plurality of electrically programmable memory cells, each of said memory cells having a current path between an array source node and a bit line node, said method comprising the steps of:

sensing a control signal having first and second states indicative of read or program operation, respectively;

decoding an address of a selected memory cell;

coupling said array source node of said selected memory cell to a program bias voltage in response to sensing the second state of said control signal, and to ground in response to sensing the first state of said sensed control signal;

coupling said bit line node of said selected memory cell to ground in response to sensing the second state of said control signal, and to a read bias voltage in response to sensing the first state of said sensed control signal; and reading said selected memory cell in response to sensing the first state of said control signal, and programming said selected memory cell in response to sensing the second state of said control signal.

25. The method as set forth in claim 24, wherein said step of reading comprises:

coupling said array source node of said selected memory cell to ground;

coupling said bit line node of said selected memory cell to said read bias voltage; and sensing the voltage level of said bit line node.

26. The method as set forth in claim 24, wherein said step of programming comprises:

coupling said array source node of said selected memory cell to said program bias voltage;

coupling said bit line node of said selected memory cell to ground; and applying a high voltage to a gate of said selected memory cell.

* * * * *